US011536787B2

(12) United States Patent
Forthmann et al.

(10) Patent No.: US 11,536,787 B2
(45) Date of Patent: Dec. 27, 2022

(54) MAGNETIC FIELD GRADIENT COILS WITH CLOSELY PACKED WINDINGS AND METHODS OF MANUFACTURING SAME

(71) Applicant: KONINKLIJKE PHILIPS N.V., Eindhoven (NL)

(72) Inventors: Peter Forthmann, Hamburg (DE); Jerry Alden, Schenectady, NY (US); Thomas Erik Amthor, Hamburg (DE); Jeffrey Edward Leach, Latham, NY (US); Joseph C. Testa, Latham, NY (US)

(73) Assignee: Koninklijke Philips N.V., Eindhoven (NL)

(*) Notice: Subject to any disclaimer, the term of this patent is extended or adjusted under 35 U.S.C. 154(b) by 611 days.

(21) Appl. No.: 16/063,305

(22) PCT Filed: Dec. 21, 2016

(86) PCT No.: PCT/IB2016/057850
§ 371 (c)(1),
(2) Date: Jun. 18, 2018

(87) PCT Pub. No.: WO2017/115224
PCT Pub. Date: Jul. 6, 2017

(65) Prior Publication Data

US 2018/0372821 A1 Dec. 27, 2018

Related U.S. Application Data

(60) Provisional application No. 62/273,525, filed on Dec. 31, 2015.

(51) Int. Cl.
*G01R 33/385* (2006.01)
*H01F 41/071* (2016.01)

(52) U.S. Cl.
CPC ....... *G01R 33/3858* (2013.01); *H01F 41/071* (2016.01)

(58) Field of Classification Search
CPC ............ G01R 33/3858; G01R 33/3856; G01R 33/3806; G01R 33/385; H01F 41/071; H01F 5/003; H01L 23/645; H01H 50/005
(Continued)

(56) References Cited

U.S. PATENT DOCUMENTS 4,617,516 A 10/1986 Schenck
4,910,462 A 3/1990 Roemer et al.
(Continued)

FOREIGN PATENT DOCUMENTS

| | | | | |
|---|---|---|---|---|
| JP | 0464340 A | | 2/1992 | |
| JP | 2004065750 | * | 3/2004 | ........... G01R 33/385 |
| JP | 2004065750 A | | 3/2004 | |

OTHER PUBLICATIONS

Harris et al "Electromagnet Design Allowing Explicit and Simultaneous Control of Minimum Wire Spacing and Field Uniformity" Concepts in Magnetic Resonance Part B.: Magnetic Resonance Engineering, vol. 41B, No. 4, Oct. 1, 2012, p. 120-129.

*Primary Examiner* — Patrick Assouad
*Assistant Examiner* — Trung Q Nguyen

(57) ABSTRACT

A magnetic field z-gradient coil is manufactured by inserting elements (38) into openings (36) on an outside of an insulating carrier (32), wrapping an electrical conductor turn (34) around the outside of the insulating carrier with one side of the wrapped electrical conductor alongside elements inserted into openings on the outside of the insulating carrier, removing the elements alongside the one side of the wrapped electrical conductor from the openings, and repeating to wrap conductor turns of a z-gradient coil (20) around the electrically insulating carrier. A transverse magnetic field gradient coil is manufactured by laying electrical conductor (Continued)

(44) onto a mold (50) with a keying feature (46, 46*a*) extending along the conductor engaging a mating keying feature (52, 52*a*) of the mold that defines a winding pattern (56), attaching an insulating back plate (58) to the resulting coil section opposite from the mold, and removing the mold.

18 Claims, 7 Drawing Sheets

(58) Field of Classification Search
USPC ................ 324/200, 300, 318–320, 345, 377, 324/210–263, 500, 529, 750.12, 750.21, 324/754.17, 754.29
See application file for complete search history.

(56) References Cited

U.S. PATENT DOCUMENTS 5,289,129 A 2/1994 Joseph
5,409,558 A 4/1995 Takahasi et al.
5,424,643 A 6/1995 Morich et al.
5,623,208 A 4/1997 Hasegawa
6,311,389 B1 11/2001 Uosaki et al.
6,469,604 B1 * 10/2002 Palkovich ............ G01R 33/381 335/216
2002/0011912 A1 1/2002 Bird et al.
2003/0050527 A1 * 3/2003 Fox et al. ................ A61N 2/02 690/13
2007/0120630 A1 * 5/2007 Huang ...................... H01F 6/04 335/216
2009/0066463 A1 3/2009 Kolbeck et al.
2009/0189607 A1 7/2009 Sakakura
2010/0148779 A1 * 6/2010 Yin .................... G01R 33/3858 324/322
2011/0018541 A1 * 1/2011 Solf ..................... G01R 33/481 324/322
2013/0282087 A1 * 10/2013 Doan ........................ H01F 5/02 607/116
2014/0021955 A1 1/2014 Fath et al.
2015/0287531 A1 10/2015 Sano et al.
2015/0346297 A1 * 12/2015 Naka .................. G01R 33/3858 324/322
2017/0135580 A1 * 5/2017 Lips ..................... A61B 5/0035

* cited by examiner

MAGNETIC FIELD GRADIENT COILS WITH CLOSELY PACKED WINDINGS AND METHODS OF MANUFACTURING SAME

CROSS REFERENCE TO RELATED APPLICATIONS

This application is a U.S. national phase application of International Application No. PCT/IB2016/057850, filed on Dec. 21, 2016, which claims the benefit of U.S. provisional Application Ser. No. 62/273,525 filed on Dec. 31, 2015 and is incorporated herein by reference.

FIELD

The following relates generally to the magnetic field gradient coil arts, magnetic field gradient coil manufacturing arts, magnetic resonance (MR) imaging arts, and related arts.

BACKGROUND

Magnetic field gradient coils generate spatially varying magnetic fields over the examination region of a magnetic resonance (MR) imaging system. A typical horizontal bore MR scanner includes a longitudinal or z-gradient coil is provided to produce magnetic fields along the axis of the cylindrical bore (e.g., to perform slice selection), and two orthogonal transverse magnetic field gradient coils (e.g., x-gradient and y-gradient coils) that can operate together to produce transverse gradients along arbitrary transverse directions.

The z-gradient coil for a horizontal bore scanner typically includes series of circular loops encircling the horizontal bore, with the loop plane oriented generally transverse to the bore axis. A typical approach for manufacturing a z-gradient coil is to provide a cylindrical electrically insulating carrier (e.g., a dielectric former) sized to encompass the MR examination region. Generally annular grooves are formed into outer-diameter surface of the cylindrical carrier, into which the gradient coil conductor is laid.

The transverse magnetic field gradient coils of a horizontal bore MR scanner have so-called "fingerprint" conductor patterns. There are typically two pairs of such fingerprint coil sections, with the two pairs on opposite sides of examination center along the bore axis and the two fingerprint coil sections of each pair oriented facing each other across the bore. Each fingerprint coil section is usually constructed on a planar backing plate which is then bent to the appropriate curvature to extend partway around the circumference of the bore and mounted on a support. In a typical manufacturing approach a mold is provided with channels into which the gradient coil conductor is laid. The backing plate is then glued onto the coil, and finally the mold is removed.

The following discloses a new and improved systems and methods that address the above referenced issues, and others.

SUMMARY

In one disclosed aspect, a magnetic field gradient coil comprises an electrically insulating carrier, and electrical conductor turns wrapped around an outside surface of the electrically insulating carrier. The outside surface of the electrically insulating carrier includes openings arranged along one side of each electrical conductor turn. In some embodiments, at least one electrical conductor turn is spaced apart from a neighboring electrical conductor turn by a non-zero gap of 1.0 millimeter or less.

In some gradient coil embodiments as set forth in the immediately preceding paragraph, the electrically insulating carrier is a hollow cylindrical electrically insulating carrier and the electrical conductor turns are wrapped circumferentially around the outer cylindrical surface of the hollow cylindrical electrically insulating carrier. Such embodiments may, for example, provide a longitudinal magnetic field gradient coil.

In another disclosed aspect, a magnetic field gradient coil comprises an electrically insulating back plate, and an electrical conductor disposed on the backplate. A surface of the electrical conductor opposite from the electrically insulating back plate includes a keying feature extending along the length of the electrical conductor. The keying feature comprises a longitudinal groove, a longitudinal ridge, or a line of discrete protrusions spaced apart along the electrical conductor. In some embodiments, the electrical conductor is arranged in a pattern with at least some adjacent portions of the electrical conductor spaced apart by a non-zero gap of 1.0 millimeter or less. In some embodiments, the magnetic field gradient coil is a transverse magnetic field gradient coil.

In another disclosed aspect, a magnetic field gradient coil manufacturing method is disclosed, comprising: (i) inserting elements (e.g., pins or pegs) into openings (e.g., through holes or blind holes) on an outside surface of an electrically insulating carrier; (ii) wrapping an electrical conductor turn around the outside surface of the electrically insulating carrier with one side of the wrapped electrical conductor alongside elements inserted into openings on the outside surface of the electrically insulating carrier; (iii) removing the elements alongside the one side of the wrapped electrical conductor from the openings; and (iv) repeating operations (ii) and (iii) to wrap the electrical conductor turns of a magnetic field gradient coil around the outside surface of the electrically insulating carrier. The operation (i) may be performed as a single operation performed before the performing the first iteration of operation (ii); alternatively, the operation (i) may be performed as repeated operations, each repetition of the operation (i) inserting elements into openings alongside the path of the electrical conductor turn to be wrapped in the next repetition of the operation (ii).

In some gradient coil manufacturing embodiments as set forth in the immediately preceding paragraph, the electrically insulating carrier is a hollow cylindrical electrically insulating carrier. The operation (i) inserts the elements into openings on the outside of the hollow cylindrical electrically insulating carrier that define circumferential rings. The operation (ii) wraps the electrical conductor turn circumferentially around the outer cylindrical surface of the hollow cylindrical electrically insulating carrier. In these embodiments, the operation (iv) repeats operations (ii) and (iii) to wrap the electrical conductor turns of a longitudinal magnetic field gradient coil around the outer cylindrical surface of the hollow cylindrical electrically insulating carrier.

In another disclosed aspect, a magnetic field gradient coil manufacturing method is disclosed, comprising: (i) laying electrical conductor onto a mold with a keying feature of the electrical conductor that extends along the length of the electrical conductor engaging a mating keying feature of the mold wherein the keying feature of the mold defines a winding pattern of a coil section of a magnetic field gradient coil and the laid electrical conductor forms the coil section; (ii) attaching an electrically insulating back plate to a side of the coil section opposite from the mold; and (iii) removing the mold from the coil section. In some embodiments, the keying feature that extends along the length of the electrical conductor is a groove, and the mating keying feature of the mold is a ridge or a line of spaced apart discrete protrusions that defines the winding pattern of the coil section. Conversely, in some embodiments, the keying feature that extends along the length of the electrical conductor is a ridge or a line of discrete protrusions spaced apart along the electrical conductor, and the mating keying feature of the mold is a groove that defines the winding pattern of the coil section. In latter embodiments, after removing the mold the keying feature may be machined off the laid electrical conductor forming the coil section.

One advantage resides in providing a magnetic field gradient coil with closer-packed windings.

Another advantage resides in providing a magnetic field gradient coil with higher current carrying capacity.

Another advantage resides in providing improved magnetic field gradient coil manufacturing enabling finite conductor spacing of arbitrarily close spacing.

Another advantage resides in providing improved magnetic field gradient coil manufacturing with easier mold removal.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
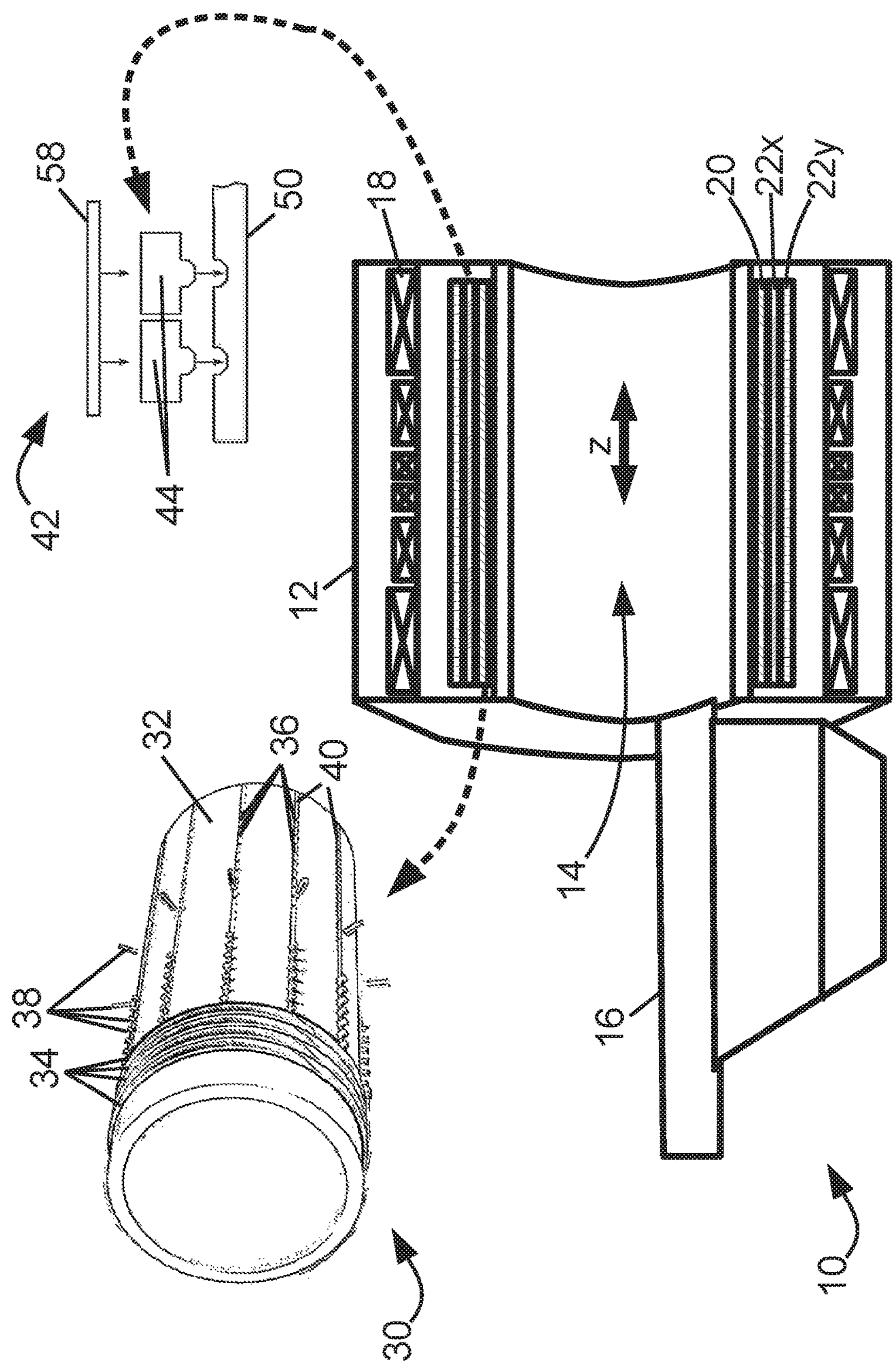
FIG. 1 diagrammatically illustrates a magnetic resonance (MR) imaging device in side sectional view with magnetic field gradient coils as disclosed herein.

The following notational comments are provided. The term “gradient coil” may sometimes be used herein as shorthand for “magnetic field gradient coil”. The term “conductor” or “conductor turn” may be used herein as shorthand for “electrical conductor” or “electrical conductor turn”, respectively. The term “electrical conductor” as used herein refers to an electrical wire or the like of a suitable electrically conductive material such as copper or a copper alloy, which may have a circular, oval, rectangular, or otherwise-shaped cross-section, and which may optionally include a surrounding electrical insulator. Where spacing between adjacent electrical conductor portions or neighboring electrical conductor turns is referred to herein, the spacing is measured between the outer surfaces of any such electrical insulation coating the respective conductor portions or turns. The term “carrier” or “insulating carrier” may be used as shorthand for “electrically insulating carrier”.

A difficulty recognized herein with laying electrical conductor turns of a longitudinal magnetic field gradient coil into annular grooves formed in the outer cylindrical surface of the hollow cylindrical electrically insulating carrier is that the minimum spacing between adjacent conductor turns is limited by the minimum wall thickness between adjacent annular grooves formed into the outer cylindrical surface of the hollow cylindrical electrically insulating carrier.

Likewise, a difficulty recognized herein with laying electrical conductor of a transverse magnetic field gradient coil into grooves formed into the surface of a mold that define the fingerprint pattern of a coil section is that the minimum spacing between adjacent conductor portions in the coil section is limited by the minimum wall thicknesses between adjacent grooves formed into the surface of the mold.

In practice, for typical mold or carrier materials the wall thickness between adjacent grooves should be about 2 millimeters or larger to ensure precisely controlled spacing such as is required for a high precision gradient coil. On the other hand, to achieve high gradient coil currents the electrical conductor should have a large cross-sectional area. The gradient coils are preferably low profile components. For example, in a horizontal bore MR scanner the gradient coils are suitably formed as hollow cylinder components arranged coaxially with the MR bore, and the walls of these cylinder components are preferably thin in order for the bore cross-section to be as large as possible. The twin goals of thin gradient coil cylinder walls and maximizing conductor cross-sectional area can be optimally achieved by using relatively “flat” electrical conductor with an oval or large aspect-ratio rectangular cross-section. However, using flat conductors reduces the spacing between adjacent coil turns (in a longitudinal gradient coil) or coil portions (in a coil section of a transverse gradient coil). In such a design space, the wall thicknesses between adjacent grooves of the mold or carrier can become a limiting factor that controls how closely adjacent coil turns or coil portions can be spaced.

Solutions to these problems are disclosed herein.

With reference to FIG. 1, an illustrative horizontal-bore magnetic resonance (MR) imaging device 10 is shown in side-sectional view, and includes a cylindrical housing 12 defining a horizontal bore 14 into which a patient or other imaging subject is loaded, e.g. via a translatable patient couch or support 16. The horizontal direction is commonly referred to as the z-direction in describing the geometry of the horizontal-bore MR scanner 10, as indicated in FIG. 1. A solenoidal-type magnet 18, which may for example be a superconducting magnet or a resistive magnet, generates a static ($B_0$) magnetic field oriented horizontally (i.e., along the z-direction) within the horizontal bore 14. A longitudinal magnetic field gradient coil 20 generates magnetic field gradients varying along the horizontal or z-direction. The longitudinal magnetic field gradient coil 20 is also sometimes referred to as the magnetic field z-gradient coil 20. Additionally, one or more transverse magnetic field gradient coils are provided which generate magnetic field gradients oriented along directions orthogonal to the z-direction. These may, for example, include one transverse magnetic field gradient coil 22*x* generating magnetic field gradients along a direction designated as the x-direction, and a second transverse magnetic field gradient coil 22*y* generating magnetic field gradients along a direction designated as the y-direction, where the x- and y-directions are mutually orthogonal. As is known in the art, magnetic resonance is excited in a subject disposed in the examination region 14 by action of one or more radio frequency (RF) coils (not shown) emitting at the magnetic resonance frequency corresponding to the magnitude of the $B_0$ magnetic field (possibly altered by magnetic field gradients), and the magnetic resonance signals are detected by the same or different one or more RF coils. Magnetic field gradients applied by the magnetic field gradient coils 20, 22*x*, 22*y* are used to spatially limit the magnetic resonance and/or to spatially encode the frequency and/or phase of the magnetic resonance to produce imaging data, or may be used for other functions (e.g. providing flow contrast in certain magnetic resonance angiography techniques).

Figure 2:
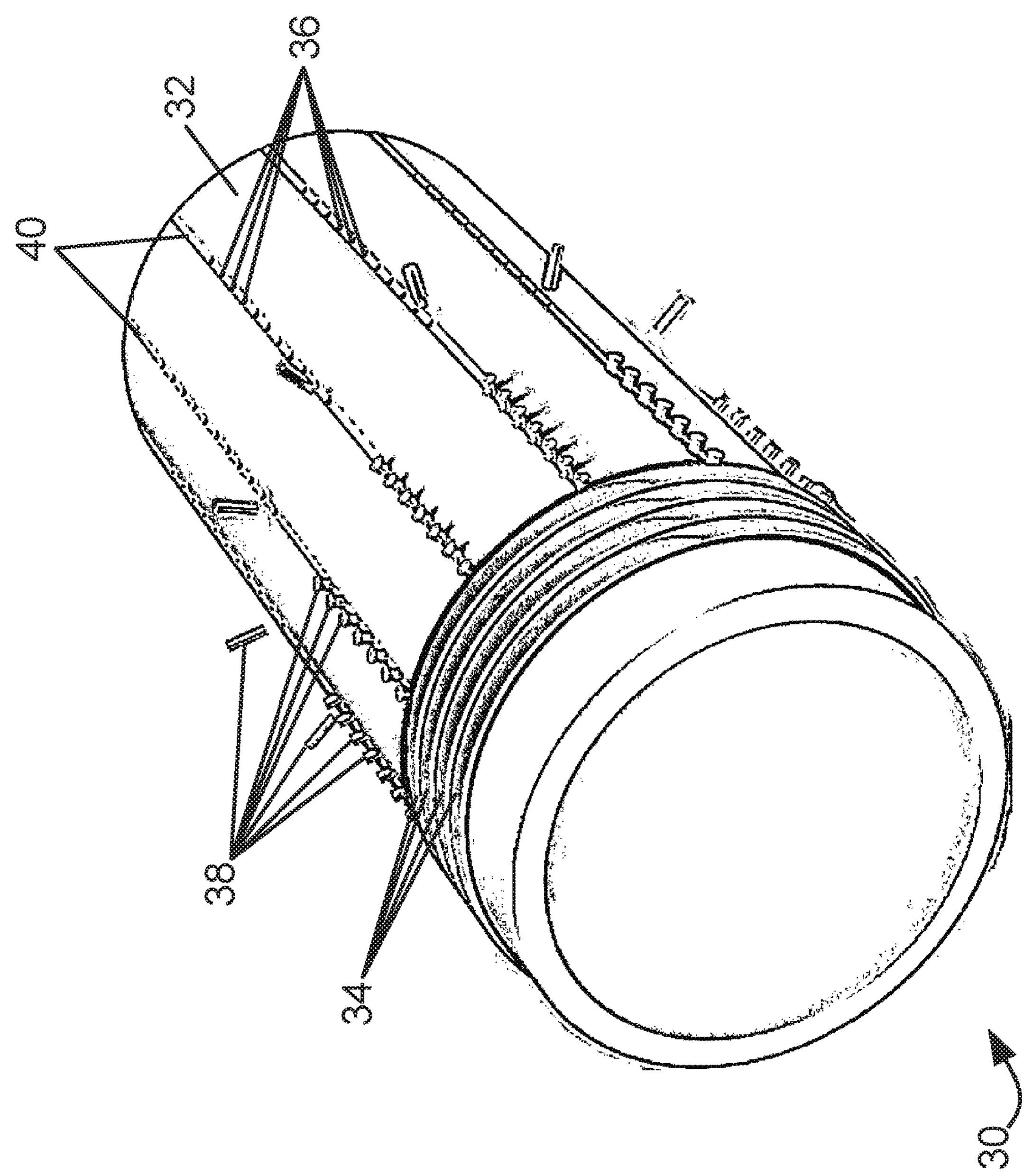
FIG. 2 diagrammatically shows a perspective view of a partially fabricated longitudinal magnetic field gradient coil.

With continuing reference to FIG. 1 and with further reference to FIG. 2, a partly manufactured z-gradient coil 30 is shown as an inset of FIG. 1 and is shown in larger view in FIG. 2. This partly manufactured z-gradient coil 30 may, for example, when completed be installed in the MR device 10 as the z-gradient coil 20. A hollow cylindrical electrically insulating carrier 32 serves as the structural support. The carrier 32 may, for example, be made of G-10 or FR-4 fiberglass sheet or board material shaped into a cylinder. Electrical conductor turns 34 are wrapped circumferentially around an outside surface of the hollow cylindrical electrically insulating carrier 32, for example in an anti-Helmholtz layout to obtain the desired longitudinally varying magnetic field gradient when the coil is electrically energized. To achieve precise alignment of the conductor turns 34, an elements in openings arrangement is used as disclosed herein. To this end, as seen in FIG. 2 the electrically insulating carrier 32 has a set of pre-formed openings (e.g. through holes or blind holes) 36 arranged so that there is one ring of openings positioned to be alongside each intended conductor turn path. Elements 38 (e.g. pins or pegs) are inserted into the openings 36 at least for the openings of the ring alongside which the next conductor turn is to be wrapped. The (next) conductor turn 34 is wrapped around the outside surface of the carrier 32 with one side of the conductor turn 34 alongside (and preferably contacting) pins 38 positioned alongside the intended conductor turn path. This provides the precision positioning of the conductor turn 34. Then, the pins alongside the just-wrapped conductor turn are removed, thus freeing up the space next to that turn to allow the next conductor turn to be wrapped. In this way, adjacent conductor turns can be wrapped with an electrical conductor turn spaced apart from a neighboring electrical conductor turn by a non-zero gap of 1.0 millimeter or less, or even closer (e.g. 0.5 millimeter or less), and more generally with a non-zero gap as small as desired.

It will be noted that in the finished z-gradient coil 20, no pins or pegs 38 will remain, as they are removed after they have served their purpose of guiding the wrapping of the electrical conductor turns 34. In the final z-gradient coil, the outside surface of the electrically insulating carrier 32 includes openings 36 arranged along one side of each electrical conductor turn 34. Typically, the outside of the electrically insulating carrier 32 does not include openings arranged along the other side of each electrical conductor turn 34, since the coil turn alignment is single-sided. However, it is possible in some particular coil layouts that openings used for aligning one coil turn may happen to line up with the opposite side of another coil turn. Unlike in conventional coil assembly approaches, when using the disclosed pin or peg in opening alignment process the electrical conductor turns 34 are not disposed in grooves on the outside surface of the electrically insulating carrier 32. Optionally, shallow grooves 40 are provided leading into the openings 36 to provide pathways to facilitate dispersal of an optional protective encapsulant, such as epoxy (not shown), into the openings 36.

Figure 3A:
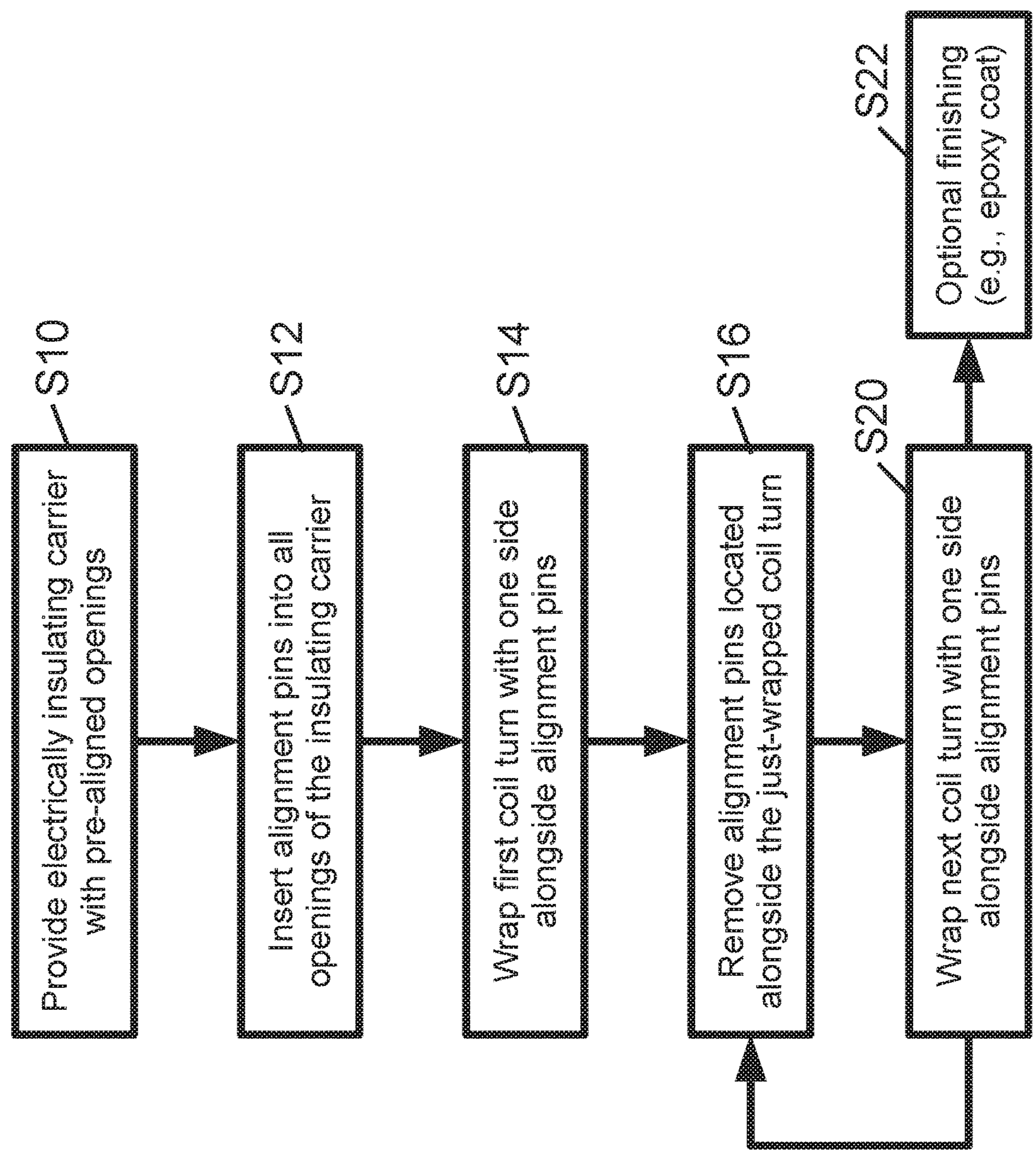
FIGS. 3A and 3B show flowcharts of two suitable processes for manufacturing a longitudinal magnetic field gradient coil in accordance with FIG. 2.

With continuing reference to FIG. 2 and with further reference to FIG. 3A, a manufacturing method in accord with FIG. 2 is shown by way of a flow chart in FIG. 3A. In an operation S10, the hollow cylindrical electrically insulating carrier 32 with pre-aligned openings 36. In an operation S12, the pins or pegs 38 are inserted into all the openings 36 of the carrier 32. In an operation S14 the first coil turn 34 is wrapped around the carrier 32 with one side alongside (and preferably contacting) a loop of pins or pegs 38 that are inserted into openings. This first coil turn is at an end of the carrier 32 so that there are no inserted pins or pegs present on the other side of the conductor for aligning a neighboring conductor turn. In an operation S16, the alignment pins or pegs 38 alongside the one side of the just-wrapped conductor turn are removed, thereby freeing up the space on the one side of the just-wrapped conductor turn to receive a (possibly very closely neighboring) next coil turn. In an operation S20, that next electrical conductor turn is wrapped alongside the (next ring of) pins or pegs inserted into openings. Flow then returns to the pin removal operation S16 in an iterative loop which is performed until all conductor turns 34 are wrapped circumferentially around the carrier 32. One or more optional finishing operations S22 may be performed, such as applying an encapsulating epoxy over the coil turns 34 (with the optional shallow grooves 40 promoting filling of the openings 36 by epoxy).

In the approach of FIG. 3A, the operation S12 is a single operation that inserts all pins or pegs 38 into all openings 36 before the first conductor turn is wrapped. This has an advantage in that during the conductor turn wrapping phase (operations S14, S16, S20) no pins or pegs need to be inserted. However, a disadvantage of this approach is that there must be enough pins or pegs available to fill all of the openings 36.

Figure 3B:
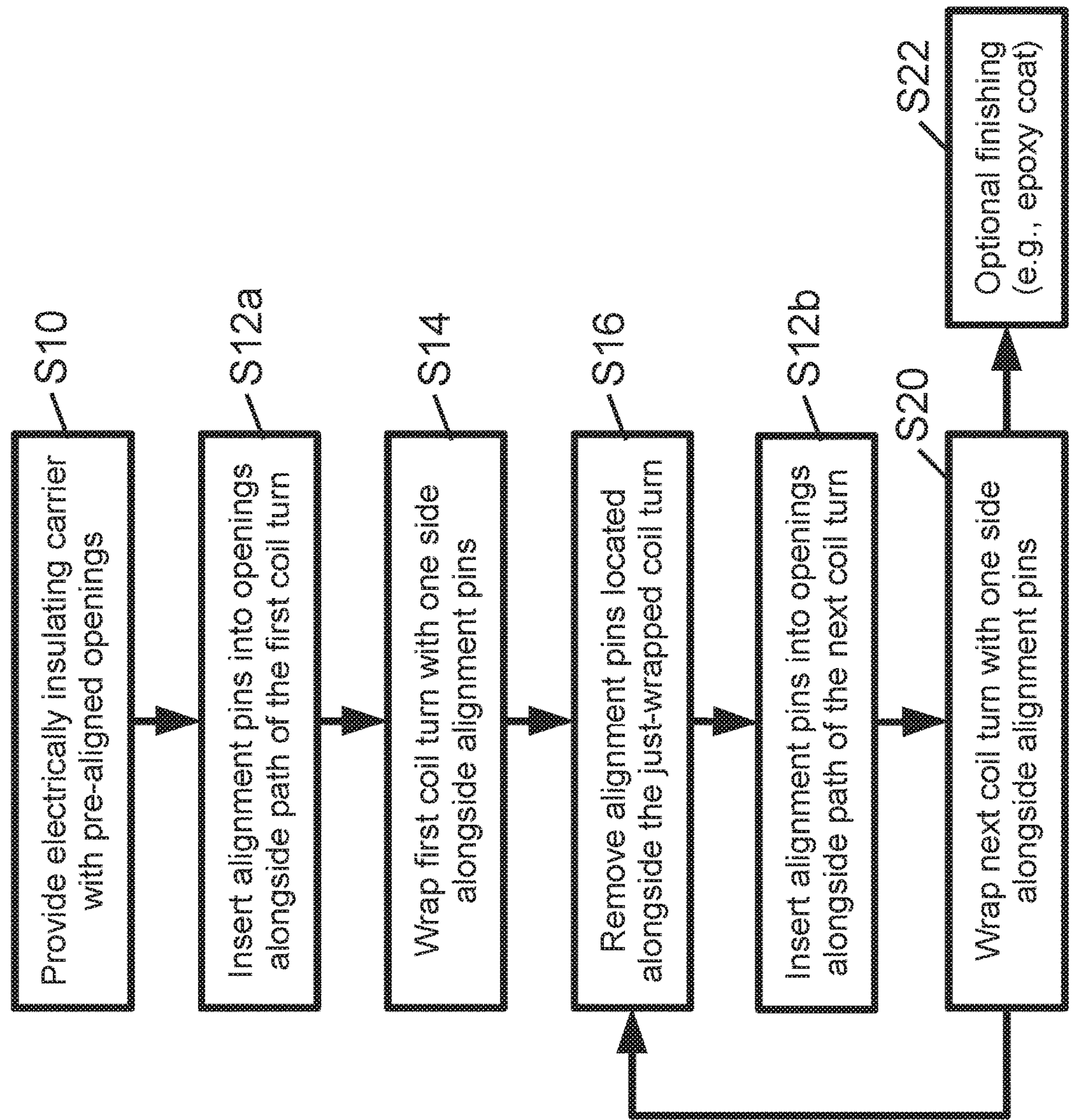

With reference to FIG. 3B, in an alternative embodiment this single peg insertion operation S12 may be divided into as repeated peg insertion operations, with each repetition being performed before wrapping the next conductor turn in order to insert pins or pegs into openings alongside the path of the next electrical conductor turn to be wrapped. Thus, in the modified approach of FIG. 3B, an initial insertion operation S12*a* inserts pins or pegs only into the ring of openings located alongside the intended path of the first coil turn to be wrapped in the operation S14. The operation S16 removes these pins after the conductor turn is wrapped, and an insertion operation S12*b* then inserts these just-removed pins into the ring of openings alongside the path of the next electrical conductor turn to be wrapped in operation S20. This approach has the advantage that only enough pins or pegs need to be on hand to fill one ring of openings 36 alongside the path of the next electrical conductor turn to be wrapped.

Figure 4:
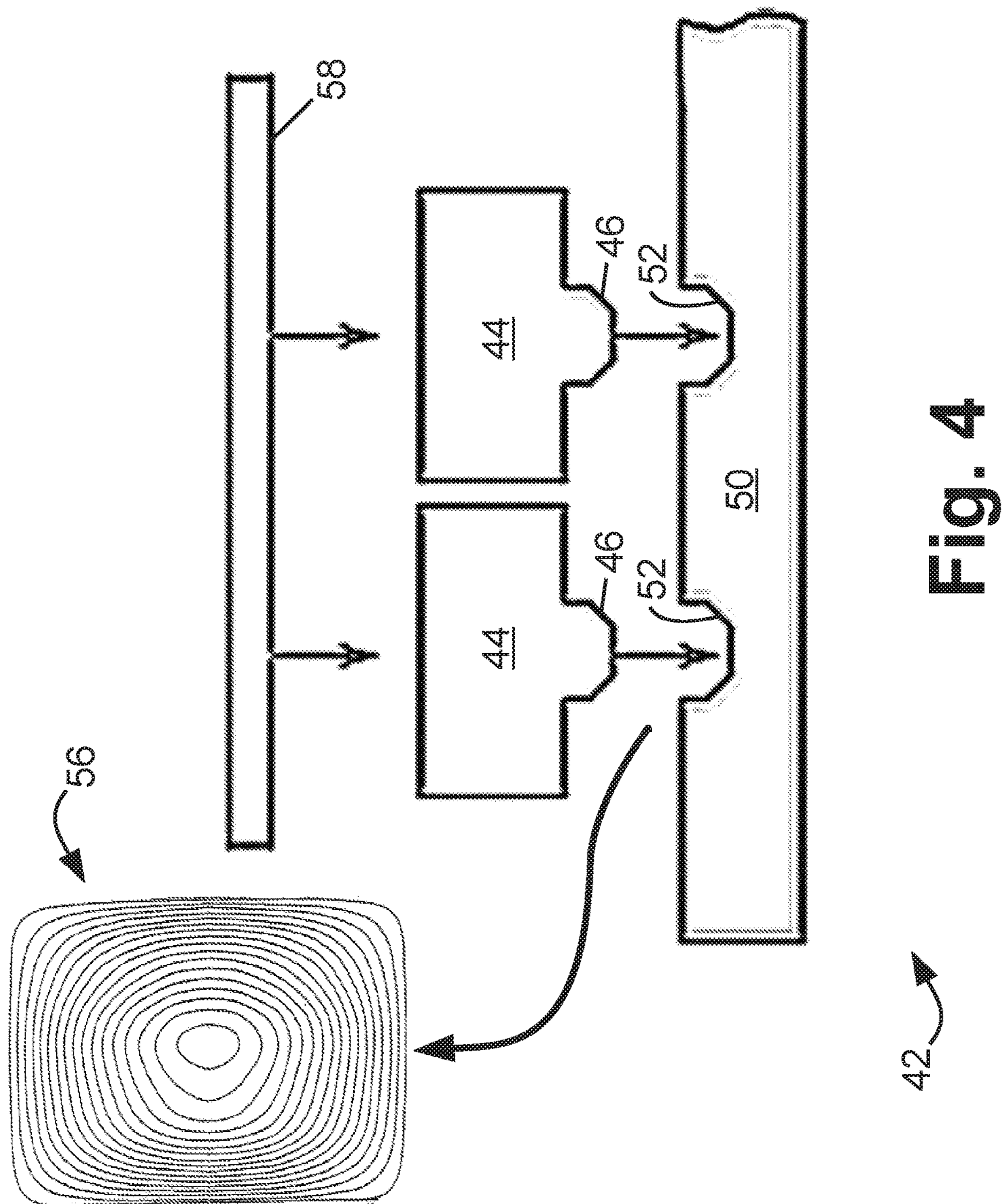
FIG. 4 diagrammatically shows a side sectional exploded view of a portion of a coil section of a transverse magnetic field gradient coil including conductors, a mold for the conductors, and the gradient coil backing plate, for an embodiment including groove keying features in the mold and ridge keying features on the conductors.

With reference back to FIG. 1 and with further reference to FIG. 4, a partly manufactured coil section 42 of a transverse magnetic field gradient coil is shown as an inset of FIG. 1 and is shown in larger view in FIG. 4. The view of FIG. 4 is cross-sectional, through two adjacent conductor portions. The partly manufactured coil section 42 may, for example, when completed may be incorporated into a transverse gradient coil that may be installed in the MR device 10 as the x-gradient coil 22*x*, or as the y-gradient coil 22*y*. In disclosed transverse gradient coil manufacturing approaches, electrical conductor 44 forming the coil section includes a keying feature that extends along the length of the electrical conductor. In the embodiment of FIG. 4, the keying feature on the electrical conductor 44 is a ridge 46 that extends along the length of the electrical conductor 44. Alternatively, the ridge 46 may be replaced by a line of discrete protrusions spaced apart along the electrical conductor.

A mold 50 is provided, onto which the electrical conductor 44 is laid. The mold 50 is preferably made of a suitably sturdy material, and may for example be a stainless steel plate or aluminum alloy plate. The mold 50 includes a keying feature, namely a groove 52 in the embodiment of FIG. 4, that defines an intended winding pattern 56 (shown in inset plan view in FIG. 4) of the coil section. The electrical conductor 44 is laid onto the mold 50 with the keying feature (e.g. ridge 46) of the electrical conductor 44 engaging the mating keying feature (e.g. groove 52) of the mold 50—in this way, the laid down electrical conductor 44 assumes the winding pattern 56 defined by the keying feature 52 of the mold 50. Thereafter, an electrically insulating back plate 58 is attached to the side of the coil section opposite from the mold, e.g. by an epoxy adhesive, and the mold 50 is removed from the coil section. The electrically insulating back plate 58 may, for example, be a G-10 or FR-4 fiberglass sheet or board.

Figure 5:
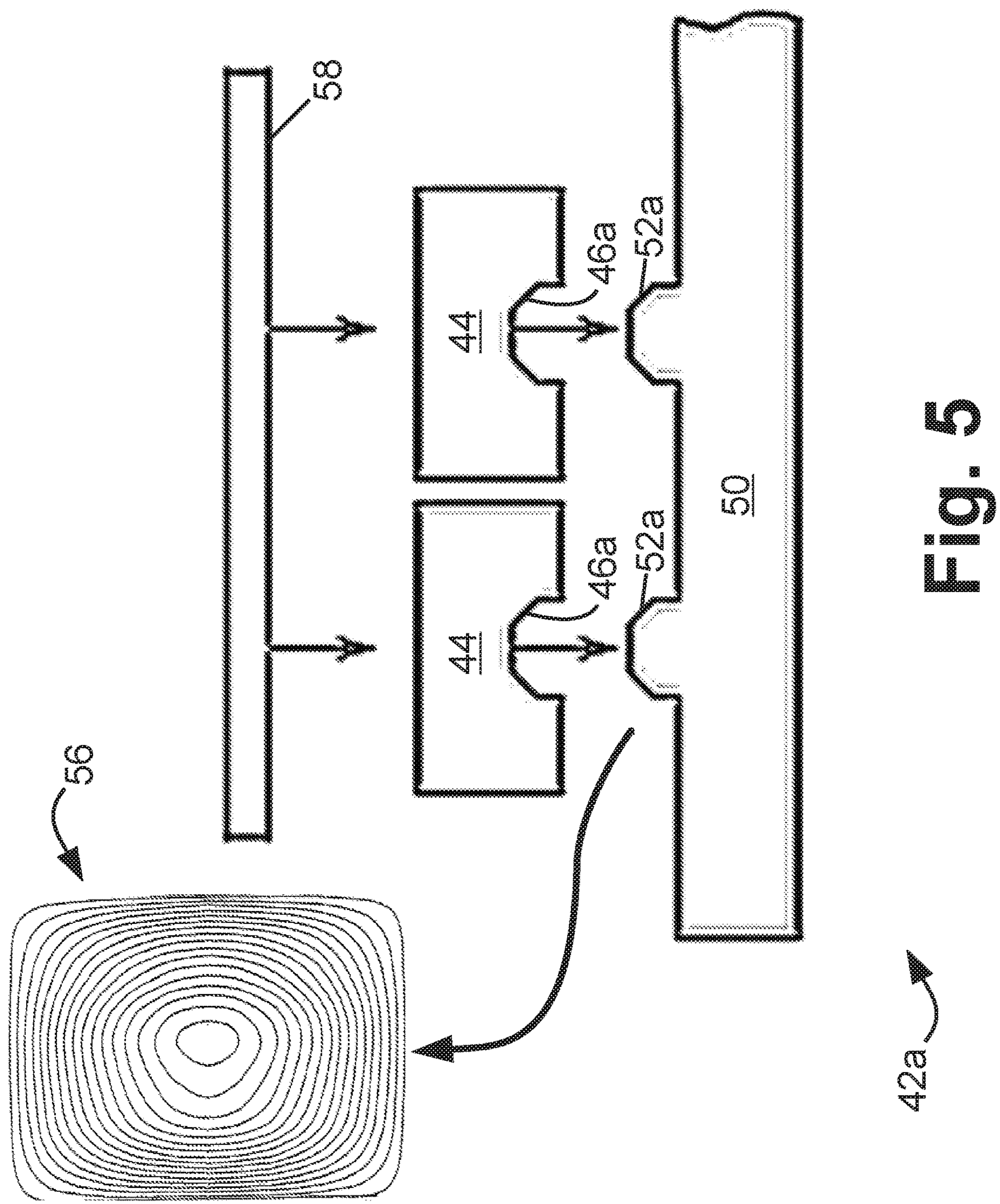
FIG. 5 diagrammatically shows a side sectional exploded view of a portion of a coil section of a transverse magnetic field gradient coil including conductors, a mold for the conductors, and the gradient coil backing plate, for an embodiment including ridge keying features on the mold and groove keying features in the conductors.

With reference to FIG. 5, it will be appreciated that in an alternative embodiment the keying features can be reversed. FIG. 5 shows a partly manufactured coil section 42*a* of such an alternative embodiment, in which the keying feature of the electrical conductor 44 is a groove 46*a*, and the keying feature of the mold 50 is a ridge 52*a* (or, in a variant embodiment, the ridge 52*a* is replaced by a line of spaced apart discrete protrusions that defines the winding pattern 56 of the coil section).

With reference to FIG. 4 or FIG. 5, it will be appreciated that because the precision layout of the conductor 44 in the desired winding pattern 56 is achieved by mating of the respective keying features 46, 52 (or respective keying features 46*a*, 52*a*), no lower limit is placed on the spacing between two adjacent conductor portions of the winding pattern 56. In some embodiments, the electrical conductor 44 is arranged in the winding pattern 56 with at least some adjacent portions of the electrical conductor 44 spaced apart by a non-zero gap of 1.0 millimeter or less, or even closer (e.g. 0.5 millimeter or less), and more generally with a non-zero gap as small as desired.

Figure 6:
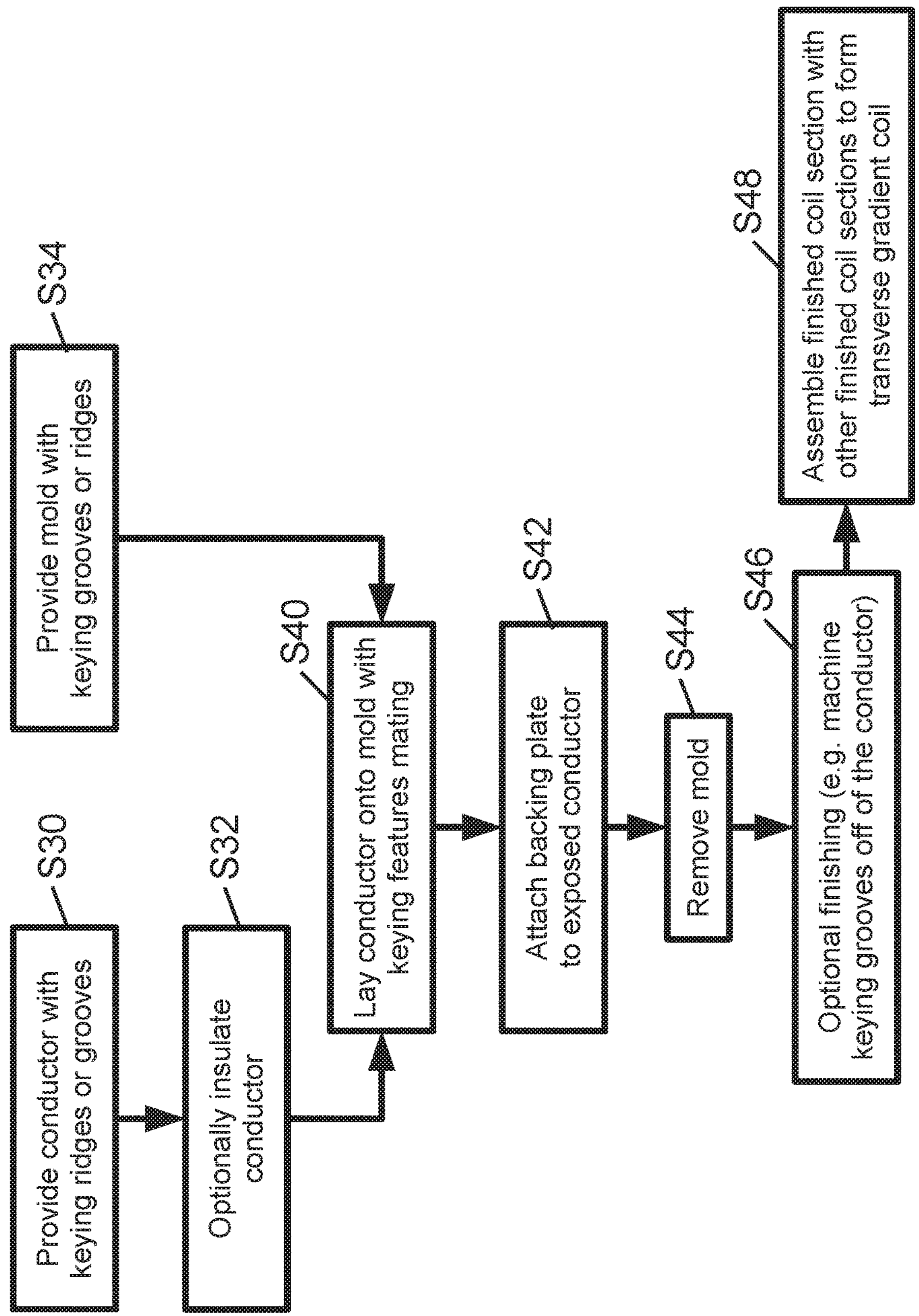
FIG. 6 shows a flowchart of a manufacturing process for manufacturing a coil section of a transverse magnetic field gradient coil in accordance with FIG. 4 or FIG. 5.

With continuing reference to FIG. 4 (or FIG. 5) and with further reference to FIG. 6, a manufacturing method in accord with FIG. 4 or FIG. 5 is shown by way of a flow chart in FIG. 6. In an operation S30, the electrical conductor 44 is provided with the keying feature (e.g. the ridge or line of protrusions 46, or the groove 46*a*). Operation S30 may, for example, be performed by extrusion through a suitably shaped extrusion die, so that the keying feature 46, 46*a* is formed integrally with an extruded electrical conductor 44. Alternatively, the keying groove 46*a* could be cut into the conductor 44 after extrusion using suitable machinery, e.g. slot cutting. In the case of the keying feature 46 being the ridge or line of protrusions 46, it is again contemplated to form these features after extrusion of the conductor 44 using suitable machining. In an optional operation S32, an optional insulating coating may be added to the electrical conductor 44 (alternatively, the conductor may be bare wire or the like). In an operation S34, the mold 50 is provided with the keying grooves 52 or ridges or protrusions 52*a* formed in the desired winding pattern 56. The keying features 52, 52*a* may be formed on a sheet of stainless steel, aluminum alloy, or the like with high precision using precision robotic machining or the like.

In an operation S40, the electrical conductor 44 is laid down onto the mold 50 with the keying feature 46, 46*a* on or in the conductor 44 engaging the mating keying feature 52, 52*a* on or in the mold 50, so that the laid-down conductor assumes the desired winding pattern 56 defined by the layout of the keying feature 52, 52*a* on or in the mold 50. In an operation S42, the electrically insulating backing plate 58 is attached to the side of the coil section opposite from the mold 50, e.g. by an epoxy adhesive. In an operation S44, the mold 50 is removed from the coil section. It will be appreciated that the mold removal operation 50 may be made easier by embodiments in which the ridge keying feature is replaced by a line of discrete protrusions, so that the strength of engagement of the mating keying features is reduced by having a reduced total surface area of contact.

One or more optional finishing operations S46 may be performed, such as machining off the ridge or line of protrusions 46 (for the embodiment of FIG. 4), and/or encapsulating the coil section adhered to the backing plate 58 in protective epoxy, or so forth. The resulting structure is a coil section, e.g. one fingerprint of a transverse gradient coil that typically includes four such fingerprint coil sections. Accordingly, in an assembly operation S48, the finished coil section is assembled with other finished coil sections to construct the final transverse gradient coil, e.g. the x-gradient coil 22*x* or the y-gradient coil 22*y* shown in illustrative FIG. 1. This assembly typically entails bending the back plate 58 (and hence the carried conductors) into a desired coil curvature and mounting the bent backing plate onto a cylindrical former or other transverse coil support.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic field gradient coil comprising:

an electrically insulating carrier; and electrical conductor turns circumferentially wrapped around an outside surface of the electrically insulating carrier to form a longitudinal magnetic field gradient coil, wherein the electrical conductor turns are not disposed in grooves on an outside surface of the electrically insulating carrier;

wherein the outside surface of the electrically insulating carrier includes openings arranged along one side of each electrical conductor turn, wherein the openings are shaped to receive pins or pegs; and wherein at least one electrical conductor turn is spaced apart from a neighboring electrical conductor turn by a non-zero gap of 1.0 millimeter or less.

2. The magnetic field gradient coil of claim 1 wherein the outside of the electrically insulating carrier does not include openings arranged along the other side of each electrical conductor turn.

3. The magnetic field gradient coil of claim 1, wherein the openings are through-holes or blind-holes.

4. The magnetic field gradient coil of claim 1, wherein the electrically insulating carrier is a hollow cylindrical electrically insulating carrier.

5. A magnetic field gradient coil comprising:

a mold including a keying feature that defines a winding pattern of a coil section of the magnetic field gradient coil;

an electrically insulating back plate; and an electrical conductor disposed on the backplate;

wherein a surface of the electrical conductor opposite from the electrically insulating back plate includes a keying feature extending along the length of the electrical conductor, the keying feature comprising a longitudinal groove, a longitudinal ridge, or a line of discrete protrusions spaced apart along the electrical conductor, the keying feature of the electrical conductor mated with the keying feature of the mold.

6. The magnetic field gradient coil of claim 5 wherein the keying feature is a longitudinal groove.

7. The magnetic field gradient coil of claim 5 wherein the electrical conductor is arranged in a winding pattern with at least some adjacent portions of the electrical conductor spaced apart by a non-zero gap of 1.0 millimeter or less.

8. The magnetic field gradient coil of claim 5 wherein the keying feature is a longitudinal ridge.

9. The magnetic field gradient coil of claim 5 wherein the keying feature is a line discrete protrusions spaced apart along the electrical conductor.

10. The magnetic field gradient coil of claim 5, wherein the magnetic field gradient coil is a transverse magnetic field gradient coil.

11. A magnetic field gradient coil manufacturing method comprising:

(i) inserting elements into openings on an outside surface of an electrically insulating carrier;

(ii) wrapping an electrical conductor turn around the outside surface of the electrically insulating carrier with one side of the wrapped electrical conductor alongside elements inserted into openings on the outside surface of the electrically insulating carrier and the other side of the wrapped electrical conductor not alongside elements inserted into openings on the outside surface of the electrically insulating carrier;

(iii) removing the elements alongside the one side of the wrapped electrical conductor from the openings; and (iv) repeating operations (ii) and (iii) to wrap the electrical conductor turns of a magnetic field gradient coil around the outside surface of the electrically insulating carrier.

12. The magnetic field gradient coil manufacturing method of claim 11 wherein the elements are pins or pegs and the openings are through holes or blind holes.

13. The magnetic field gradient coil manufacturing method of claim 11 wherein:

the electrically insulating carrier is a hollow cylindrical electrically insulating carrier, operation (i) inserts the elements into openings on the outside of the hollow cylindrical electrically insulating carrier that define circumferential rings;

operation (ii) wraps the electrical conductor turn circumferentially around the outer cylindrical surface of the hollow cylindrical electrically insulating carrier; and operation (iv) repeats operations (ii) and (iii) to wrap the electrical conductor turns of a longitudinal magnetic field gradient coil around the outer cylindrical surface of the hollow cylindrical electrically insulating carrier.

14. The magnetic field gradient coil manufacturing method of claim 11 wherein the operation (i) is performed one of:

(I) as a single operation performed before the performing the first iteration of operation (ii); or (II) as repeated operations, each repetition of the operation (i) inserting elements into openings alongside the path of the electrical conductor turn to be wrapped in the next repetition of the operation (ii).

15. A magnetic field gradient coil manufacturing method comprising:

(i) laying electrical conductor onto a mold with a keying feature of the electrical conductor that extends along the length of the electrical conductor engaging a mating keying feature of the mold wherein the keying feature of the mold defines a winding pattern of a coil section of a magnetic field gradient coil and the laid electrical conductor forms the coil section;

(ii) attaching an electrically insulating back plate to a side of the coil section opposite from the mold; and (iii) removing the mold from the coil section.

16. The magnetic field gradient coil manufacturing method of claim 15 wherein:

(A) the keying feature that extends along the length of the electrical conductor is a groove; and the mating feature of the mold is a ridge or a line of spaced apart discrete protrusions that defines the winding pattern of the coil section; or (B) the keying feature that extends along the length of the electrical conductor is a ridge or a line of discrete protrusions spaced apart along the electrical conductor; and the mating keying feature of the mold is a groove that defines the winding pattern of the coil section.

17. The magnetic field gradient coil manufacturing method of claim 16 further comprising:

(vi) after removing the mold, machining the keying feature off the laid electrical conductor forming the coil section.

18. The magnetic field gradient coil manufacturing method of claim 15 wherein the electrical conductor is arranged in the winding pattern with at least some adjacent portions of the electrical conductor spaced apart by a non-zero gap of 1.0 millimeter or less.

* * * * *